US006721184B1

(12) United States Patent
Lehmeier et al.

(10) Patent No.: US 6,721,184 B1
(45) Date of Patent: Apr. 13, 2004

(54) MODULE FOR CONNECTING ACTUATORS AND/OR SENSORS

(75) Inventors: AnneMarie Lehmeier, Ursensollen (DE); Werner Olbrich, Amberg (DE); Wolfgang Schatz, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/958,758

(22) PCT Filed: Apr. 4, 2000

(86) PCT No.: PCT/DE00/01029

§ 371 (c)(1),
(2), (4) Date: Oct. 15, 2001

(87) PCT Pub. No.: WO00/64012

PCT Pub. Date: Oct. 26, 2000

(30) Foreign Application Priority Data

Apr. 15, 1999 (DE) .................................... 299 06 707 U

(51) Int. Cl.⁷ .................................................. H05K 5/06

(52) U.S. Cl. ....................... 361/728; 361/376; 361/752; 361/801; 361/818; 174/35 GC

(58) Field of Search ................................ 361/728, 729, 361/736, 737, 752, 801, 816, 818; 174/35 R, 35 GC

(56) References Cited

U.S. PATENT DOCUMENTS 4,870,604 A * 9/1989 Tatsuno ...................... 361/680
5,282,099 A * 1/1994 Kawagoe et al. ........ 360/97.01
5,696,648 A 12/1997 Jeong et al.
5,897,808 A * 4/1999 Kim .......................... 219/741
5,966,647 A * 10/1999 Sawai ........................ 455/300

FOREIGN PATENT DOCUMENTS

EP 0 821 434 A 1/1998
FR 2 662 030 11/1991

* cited by examiner

*Primary Examiner*—Jayprakash N. Gandhi
(74) *Attorney, Agent, or Firm*—Harness, Dickey & Pierce, P.L.C.

(57) ABSTRACT

A module includes a mounting plate and a housing, which can be swiveled onto the latter. The housing includes a housing base and a housing cover joined together with the housing base in an interlocked manner. Inserted between the housing base and the housing cover is a seal, which becomes fully functional when the housing is screwed to the mounting plate.

17 Claims, 1 Drawing Sheet

MODULE FOR CONNECTING ACTUATORS AND/OR SENSORS

This application is the national phase under 35 U.S.C. §371 of PCT International Application No. PCT/DE00/01029 which has an International filing date of Apr. 4, 2000, which designated the United States of America, the entire contents of which are hereby incorporated by reference.

1. Field of the Invention

The invention relates to a module for connecting actuators and/or sensors. Preferably, the module includes a mounting plate with a recess for receiving a form-coded flat cable and a housing which can be swiveled onto the mounting plate. It further preferably includes a printed-circuit board and a contacting device with contact pins for establishing the contact of the flat cable. The housing is preferably made up of a housing base and a housing cover to form a unit which can be disassembled and in the interior space of which the printed-circuit board is removably held.

2. Background of the Invention

A known module of a generic type is disclosed by EP 0 821 434 A1. Placed or injection-molded in the housing base is a profiled seal, which ensures adequate sealing by pressing together of the housing base and housing cover. However, the housing base and housing cover can in this case only be disassembled by destroying them, i.e. they cannot then be used again.

SUMMARY OF THE INVENTION

The invention is based on an object of improving a module of the aforementioned type in such a way that its housing can be disassembled in a simple way without destroying it, while at the same time having a module whose sealing is ensured in accordance with protection class IP 67, for example.

This and other objects are achieved by a housing base and/or the housing cover being made in a box-like form. Further, in the contacted state of the flat cable, the two components are preferably pushed one into the other in such a way that their side walls overlap at least partially with positive engagement. In addition, between the housing base and the housing cover, a peripheral seal preferably lies, which becomes fully functional, i.e. the sealing of the housing cover with respect to the housing base, when the housing is screwed to the mounting plate.

Advantageous developments of the invention can be taken from the subclaims.

BRIEF DESCRIPTION OF THE DRAWINGS

An exemplary embodiment of the invention is explained in more detail below with reference to drawings, in which.

DETAILED DESCRIPTION OF THE PREFERRED EMBODIMENTS

Figure 1:
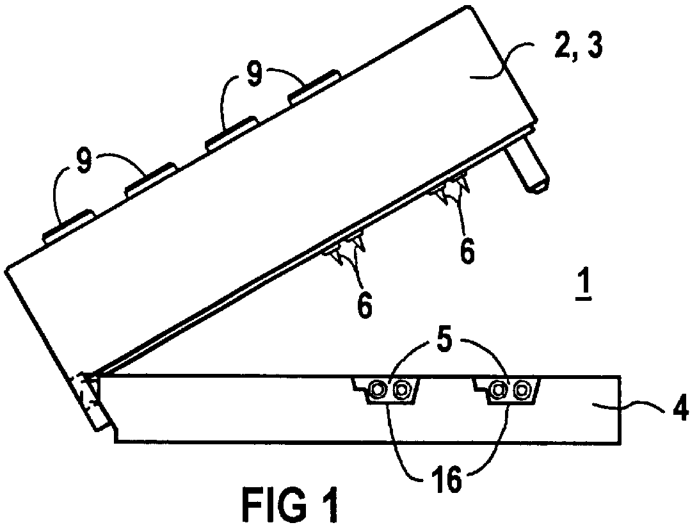
FIG. 1 shows the basic construction of a module according to the invention.

FIG. 1 shows a module 1 for connecting a plurality of stations, for example sensors and/or actuators. The module 1 serves for the exchange of data between the stations and a remote master. Connected to the module 1 as the connection to the master is a bus system, for example a two-wire line. The module 1 substantially includes a housing 2, 3 and a mounting plate 4, in the recesses 16 of which form-coded flat cables 5 are placed as two-wire lines. The housing 2, 3, which can be swiveled onto the mounting plate 4, contains a printed-circuit board, which is not visible here and onto which pointed contacting pins 6 are soldered. With these contacting pins 6 of a contacting device, which are partially protruding out of the housing 2, 3, contact of the flat cables 5 can be established by way of a penetration technique.

Figure 2:
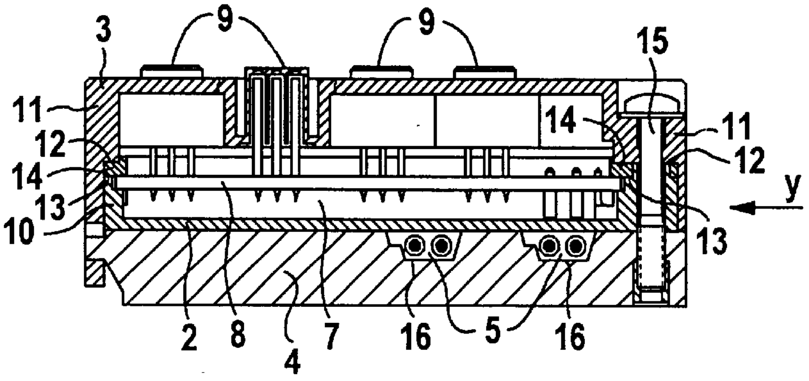
FIG. 2 shows a cross-sectional view of the module according to the invention and FIG. 3 shows a plan view of the module.

FIG. 2 shows a cross-sectional view of the module 1 in the swiveled-on state. The housing is formed by a housing base 2 and a housing cover 3 and has an interior space 7, in which the printed-circuit board 8 is mounted. The electrical connection of stations to the circuit on the printed-circuit board 8 can be established via station terminals 9 on the housing cover 3. The housing base 2 and the housing cover 3 are made in a box-like form.

In the swiveled-on state shown in FIG. 2, they have been pushed one into the other in such a way that their side walls 10 and 11 at least partially overlap with positive engagement. In the exemplary embodiment specifically shown here, the outer contour of the housing base 2 is adapted to the inner contour of the housing cover, i.e. the housing base 2 has been pushed into the housing cover 3. The housing cover 3 includes on the inner side of its side walls 11, an offset 12. Between this offset 12 and the end face 13 of the housing base 2 lies a peripheral seal 14. The housing 2, 3 is screwed by way of a screw 15 to the mounting plate 4, making the seal fully functional. That is, the sealing of the housing cover 3 with respect to the housing base, 2 makes the seal fully functional.

Figure 3:
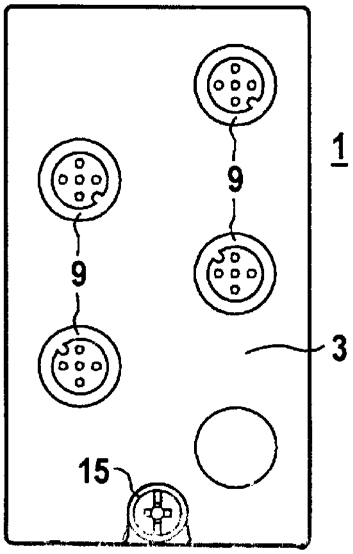

FIG. 3 shows a plan view of the module 1 with its four station terminals 9 and the mentioned screw 15 for screwing the housing 2, 3 to the mounting plate 4.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A module for connecting at least one of actuators and sensors, comprising:

a mounting plate with a recess for receiving a form-coded flat cable; and a housing, which can be swiveled onto the mounting plate, including a printed-circuit board and a contacting device with contact pins for establishing the contact of the flat cable, the housing including a housing base and a housing cover forming a unit which can be disassembled and in an interior space of which the printed-circuit board is removably held, wherein at least one of the housing base and the housing cover is made in a box-like form and, in the contacted state of the flat cable, the housing base and housing covers are pushed one into the other in such a way that side walls thereof overlap at least partially with positive engagement and wherein, between the housing base and the housing cover lies a peripheral seal, wherein the seal is fully functional and electrical connection between the printed circuit board and the flat cable is established by the housing being screwed to the mounting plate.

2. The module as claimed in claim 1, wherein the housing is capable of being swiveled onto the mounting plate.

3. The module as claimed in claim 2, wherein one of the housing cover and housing base includes an offset on an inner side of the side walls and wherein the seal lies between this offset and an end face of the other of the housing cover and housing base.

4. The module as claimed in claim 1, wherein one of the housing cover and housing base includes an offset on an inner side of the side walls and wherein the seal lies between this offset and an end face of the other of the housing cover and housing base.

5. The module of claim 1, wherein the seal becomes non-fully functional upon the housing being disconnected from the mounting plate, thereby permitting the housing base and housing cover to be disconnected.

6. The module of claim 1, wherein an outer contour of the housing base and an inner contour of the housing cover overlap.

7. A module for connecting a plurality of devices, comprising:

a mounting plate, adapted to receive a cable; and a housing, including a housing base and a housing cover, wherein at least a portion of the housing base and housing cover overlap when connected to form the housing and wherein a seal between the housing base and housing cover becomes fully functional and electrical connection between the cable and a printed circuit board is established with a connection between the housing and the mounting plate.

8. The module of claim 7, wherein the module is for connecting at least one of actuators and sensors.

9. The module of claim 7, wherein the housing houses the printed circuit board.

10. The module of claim 9, wherein the housing is connected to the mounting plate by at least one screw.

11. The module of claim 10, wherein the seal becomes non-fully functional upon the housing being disconnected from the mounting plate, thereby permitting the housing base and housing cover to be disconnected.

12. The module of claim 11, wherein at least one side wall of the housing base and housing cover overlap.

13. The module of claim 11, wherein an outer contour of the housing base and an inner contour of the housing cover overlap.

14. The module of claim 7, wherein the housing is connected to the mounting plate by at least one screw.

15. The module of claim 7, wherein the seal becomes non-fully functional upon the housing being disconnected from the mounting plate, thereby permitting the housing base and housing cover to be disconnected.

16. The module of claim 7, wherein at least one side wall of the housing base and housing cover overlap.

17. The module of claim 7, wherein an outer contour of the housing base and an inner contour of the housing cover overlap.

* * * * *